(12) United States Patent
Ito et al.

(10) Patent No.: US 6,410,904 B1
(45) Date of Patent: Jun. 25, 2002

(54) MULTI-BEAM EMITTING DEVICE

(75) Inventors: Koji Ito, Gifu-ken; Ryota Kato, Nagoya; Yutaka Hattori, Kuwana, all of (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 30 days.

(21) Appl. No.: 09/717,154

(22) Filed: Nov. 22, 2000

(30) Foreign Application Priority Data

Nov. 22, 1999 (JP) ............................................ 11-331950

(51) Int. Cl.[7] ............................................... H01L 33/00
(52) U.S. Cl. ................... 250/214 R; 250/216; 250/239; 250/552; 372/36; 438/22; 438/26; 438/28
(58) Field of Search ................................ 250/216, 239, 250/214 R, 552; 372/36; 438/22, 23, 24, 25, 26, 28

(56) References Cited

U.S. PATENT DOCUMENTS

| | | | | |
|---|---|---|---|---|
| 4,901,325 A | * | 2/1990 | Kato et al. ..................... 372/44 |
| 4,942,584 A | * | 7/1990 | Karaki et al. .................. 372/29 |
| 5,361,244 A | * | 11/1994 | Nakamura et al. ........ 369/44.23 |
| 5,485,479 A | * | 1/1996 | Kitamura et al. .............. 372/43 |
| 5,488,625 A | * | 1/1996 | Nakamori et al. ............. 372/50 |
| 5,504,350 A | * | 4/1996 | Ortyn ............................ 257/81 |
| 5,610,647 A | * | 3/1997 | Takada ........................ 347/137 |
| 5,726,437 A | * | 3/1998 | Ashikaga et al. ............ 250/205 |
| 5,781,576 A | * | 7/1998 | Kimura et al. ................. 372/45 |
| 5,834,766 A | * | 11/1998 | Suhara ........................ 250/234 |
| 5,883,385 A | * | 3/1999 | Takahashi et al. ........... 250/235 |
| 6,038,243 A | * | 3/2000 | Mogi ............................ 372/50 |
| 6,188,132 B1 | * | 2/2001 | Shih et al. .................... 257/724 |

* cited by examiner

*Primary Examiner*—Robert H. Kim
*Assistant Examiner*—Allen C. Ho
(74) *Attorney, Agent, or Firm*—Oliff & Berridge, PLC

(57) ABSTRACT

A semiconductor laser device includes a metal case. The metal case includes a brass stem and a cap that covers an upper portion of the stem and has a laser emitting hole therein. The stem is provided with a laser diode having two laser emitting portions and a photodiode. Each cathode of the laser emitting portions and the photodiode is grounded to the metal case as a common lead. Each anode of the laser emitting portions and the photodiode is insulated from the metal case and connected to respective pin protruding downward from the stem. The semiconductor laser device is provided with conductivity to the metal case by press-fitting into an aluminum support plate that is a radiating plate. The support plate is connected to a drive circuit.

20 Claims, 7 Drawing Sheets

MULTI-BEAM EMITTING DEVICE

BACKGROUND OF THE INVENTION

1. Field of Invention

The invention relates to a multi-beam emitting apparatus that is structured so that a semiconductor laser device and a support plate are surely electrically connected each other while improving their heat radiation, by press-fitting the semiconductor laser device into the support plate.

2. Description of Related Art

There is a light beam scanner that is used in a laser printer. In the light beam scanner, a light beam modulated based on an image signal is deflected by a polygon mirror so that a photosensitive body is moved in a sub-scanning direction such that the surface of the photosensitive body is scanned with the light beam as the surface of the photosensitive body is scanned with the light beam in a main scanning direction. By doing so, the surface of the photosensitive body is exposed and thus a latent image is formed thereon.

Recently, in the light beam scanner of this type, a multi-beam scanner has been proposed which simultaneously scans a plurality of scan lines with a plurality of light beams. This multi-beam scanner has a plurality of laser emitting portions, so that the multi-beam scanner can simultaneously scan the plurality of scan lines in the main scanning direction with the plurality of laser beams. Therefore, the surface of the photosensitive body can be exposed in a short time as compared with a case where the surface of the photosensitive body is scanned with one laser beam. Especially, if a laser diode, having a plurality of laser emitting portions, and a photodiode as a photoreceptor of the laser beam emitted from the laser emitting portions are provided in a same case of a semiconductor laser device, the structure of the laser-beam scanner can be simplified. Further, the pitch of two laser beams to be emitted from the laser emitting portions is maintained constant. Because the photodiode is provided inside the semiconductor laser device, no special structure for receiving light is needed in the laser-beam scanner. Therefore, the light emission from the laser emitting portions can be surely monitored by one photoreceptor. The laser-beam scanner having such a semiconductor laser device can be simplified in its structure and can be downsized.

In a conventional semiconductor laser device provided with a laser diode having one laser emitting portion (hereinafter referred to as a single LD), three connecting pins are provided. Two are provided to a case as a leg and are each connected to the laser diode and a photodiode. The other is also provided to the case as a leg and is connected to the laser diode and the photodiode as a common lead. Therefore, for example, a semiconductor laser device provided with a laser diode having two laser emitting portions (hereinafter referred to as a twin-LDs) needs four connecting pins to have the same structure as the semiconductor laser device having the single LD. Generally, soldering is an effective method to wire a fourth connecting pin for reliable connection with good conductivity. However, the laser diode cannot be soldered using an automatic soldering system because the laser diode is sensitive to heat and has a light emitting hole therein. Therefore, an expert has to manually solder the laser diode to respective portions using a loupe. In addition, the laser diode is sensitive to static electricity. Accordingly, stringent anti-static measures are required even when manually soldering, so that the operation becomes complicated. For these reasons, the production efficiency is greatly decreased even with an increase of only one soldering operation.

Further, for the semiconductor laser device with four connecting pins, a conveyance device, a testing device and the like used for handling or testing the semiconductor laser device having three connecting pins cannot be used. Therefore, devices need to be newly installed or modified to adapt for the specification of the semiconductor laser device with four connecting pins, and thus time is wasted and costs are increased.

Generally, the connecting pins are averagely arranged on the same circumference at positions where the circumference is divided into four or eight. For example, when the semiconductor laser device has three connecting pins, the pins are arranged to make an isosceles triangle. Accordingly, there is no chance that the semiconductor laser device is accidentally inserted in an incorrect direction. However, when the semiconductor laser device has four connecting pins, the pins are arranged to make a square. Therefore, it becomes easy to insert the semiconductor laser device in an incorrect direction. To prevent such a mistake, extra man-hours are needed to make the arrangement of the connecting pins irregular.

When the semiconductor laser device has the twin-LDs, there are two light emitting points, so that the amount of heat generated by the laser diodes is doubled. Accordingly, when the heat dissipating condition is the same as the semiconductor laser device having the single LD, the temperature inside of the case of the semiconductor laser device increases. As a result, the efficiency of the laser diode decreases and unevenness of exposure develops on the surface of the photosensitive body because power of the laser beams varies even though the drive current of the laser diode is constant.

SUMMARY OF THE INVENTION

The invention provides a multi-beam emitting apparatus that has high production efficiency, is easy to handle or test, and can perform stable exposure.

In order to achieve the above and other objects, the multi-beam emitting apparatus includes a plurality of laser emitting portions, a semiconductor laser device including a metal case covering the laser emitting portions therein, a support plate supporting the metal case and a drive circuit driving the laser emitting portions. One terminal of each laser emitting portion is electrically connected to the metal case inside the metal case, another terminal of each laser emitting portion is insulated from the metal case and is conducted to outside the metal case by respective connecting pins. The metal case is electrically connected to the support plate by press-fitting into the support plate, and the drive circuit is electrically connected to the support plate.

In the multi-beam emitting apparatus according to the invention, there is provided a plurality of laser emitting portions, a semiconductor laser device including a metal case covering the laser emitting portions therein, a support plate supporting the metal case, and a drive circuit driving the laser emitting portions. One terminal of each laser emitting portion is electrically connected to the metal case within the metal case. Accordingly, the number of connecting pins can be reduced as compared with a case where all electrical connections are provided using the connecting pins. Further, the metal case is electrically connected to the support plate by press-fitting into the support plate, so that high electrical conductivity can be maintained and the number of connecting pins can be reduced as compared with a case where all electrical connections are established by the connecting pins. Further, the metal case is electrically connected to the support plate by press-fitting. Therefore, excellent heat conductivity can be maintained, a reliable electrical connection can be maintained for a while without soldering, and heat generated by the laser emitting portions can be effectively dissipated.

According to one aspect of the invention, the semiconductor laser device includes a photoreceptor and the photoreceptor is electrically connected to the metal case in the inside of the metal case.

In the multi-beam emitting apparatus according to the structure, the semiconductor laser device includes a photoreceptor that is electrically connected to the metal case within the metal case. Therefore, the light amount of the laser beam can be detected with a compact structure.

According to another aspect of the invention, the connecting pins comprise four connecting pins including a connecting pin conducting electricity with the metal case. One of the connecting pins is cut off before the semiconductor laser device is press-fit into the support plate or before the connecting pins are connected to the drive circuit and then the multi-beam emitting apparatus is assembled.

In the multi-beam emitting apparatus according to the structure, four connecting pins are provided, including the connecting pin conducting to the metal case. At the time of inspection, the connecting pin conducting to the metal case is connected to the ground potential. Accordingly, the cathode of the semiconductor laser device can be easily maintained at the ground potential. Before the semiconductor laser device is press-fit into the support plate or the connecting pins are connected to the drive circuit, the connecting pin that conducts to the metal case is cut off. Therefore, the semiconductor laser device can be of the same structure, such as having three connecting pins, as the conventional semiconductor laser device having one laser emitting portion. Accordingly, the semiconductor laser device can be manufactured using a part, or all, of the conventional manufacturing equipment, such as a conveyance apparatus and a testing apparatus. Particularly, the mechanical parts of conventional manufacturing equipment have the advantage of being useable for manufacturing this structure of the semiconductor laser device.

According to another aspect of the invention, the support plate is electrically connected to a ground potential of the drive circuit.

In the multi-beam emitting apparatus according to the invention, the support plate is connected to the ground potential of the drive circuit. Therefore, when the metal frame of the multi-beam emitting apparatus is the ground potential, no special structure for conduction is needed.

According to another aspect of the invention, at least two leglike contact portions protrude through the support plate and the support plate is electrically connected to the drive circuit.

In the multi-beam emitting apparatus according to the invention, at least two leglike contact portions protrude through the support plate and the support plate is electrically connected to the drive circuit. Therefore, the occurrence of surge current can be prevented. Consequently, a malfunction of the laser drive circuit, laser emitting failure, and static damage of the laser diode can be prevented so that the laser diode can stably emit a laser beam.

According to another aspect of the invention, the support plate is provided with an engagement hole protruding from the contact portion, the drive circuit is provided with a perforation and a land covered with metal provided around the perforation, and the contact portion and the land are contact pressed to each other and are electrically connected by fixing using a screw that perforates the engagement hole of the contact portion and the perforation of the land.

In the multi-beam emitting apparatus according to the invention, the support plate and the drive circuit are fixed by a screw penetrating into an engagement hole formed in the contact portion of the support plate and the penetration hole formed in the drive circuit and the contact portion is electrically connected to a land that is a conductive portion covered with a metal provided around the penetration hole. Therefore, the drive circuit and the support plate can be easily separated from each other and a position of the drive circuit and the support plate can be relatively adjusted. Consequently, the support plate and the drive circuit can be surely electrically connected to each other and assembly, adjustment, and repair can be easily performed.

According to another aspect of the invention, the support plate is formed of a metal that is softer than the metal used for the metal case and has a penetration hole having an inside diameter 5 to 60 $\mu$m that is smaller than an outside diameter of the metal case. The support plate and an outer wall of the metal case intimately contact an inner wall of the penetration hole by press-fitting the metal case into the penetration hole so that the semiconductor laser device are electrically connected.

In the multi-beam emitting apparatus according to the invention, the support plate has the penetration hole that has an inside diameter 5–60 $\mu$m smaller than an outer diameter of the metal case and is formed of a metal that is softer then the metal case. Therefore, the metal case can be press-fit into the support plate without undue force and the metal case is intimately contacted to the support plate. Consequently, the electrical connection between the support plate and the metal case can be maintained for a while with stability, heat can be radiated from the support plate and the metal case with excellent heat conductivity, and the semiconductor laser device can be prevented from excessively increasing in temperature.

BRIEF DESCRIPTION OF THE DRAWINGS

A preferred embodiment of the invention will be described in detail with reference to the following figures wherein.

DETAILED DESCRIPTION OF PREFERRED EMBODIMENTS

A preferred embodiment of a laser-beam printer 1 to which a multi-beam emitting apparatus according to the invention is applied will be described with reference to the accompanying drawings.

First, a structure of a semiconductor laser device 6 used in a laser-beam scanner 12, that is the multi-beam emitting apparatus of the invention, will be described with reference to the drawings.

Figure 3:
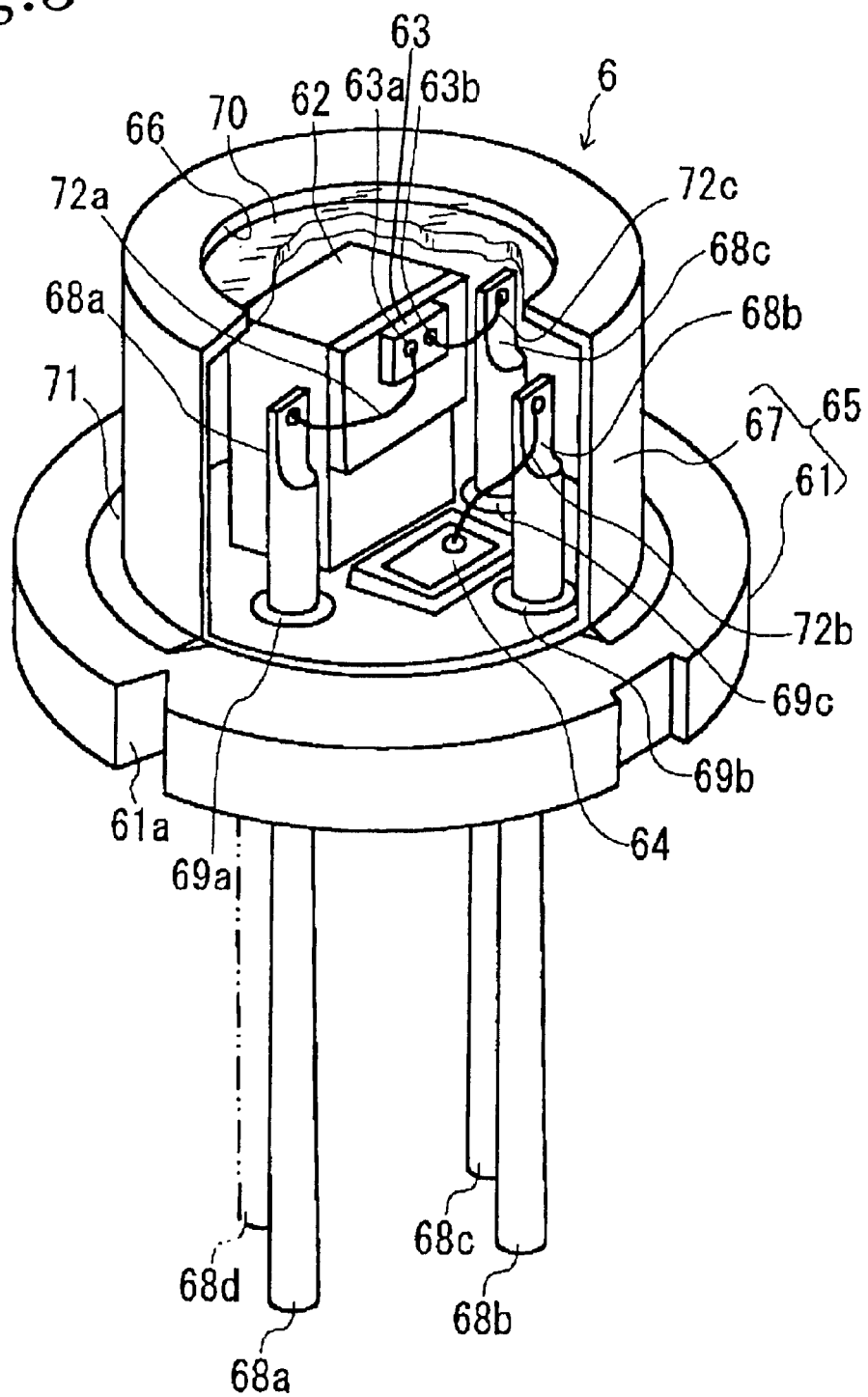
FIG. 3 is a perspective cutaway view showing a structure of a semiconductor laser device.

FIG. 3 is a perspective cutaway view showing the structure of the semiconductor laser device 6. In FIG. 3, the top-side and right-side of the drawing are defined as an upside and the right, respectively. The semiconductor laser device 6 is formed with a metal case 65. The metal case 65 includes a stem 61 and a cap 67 disposed to cover the upper portion of the stem 61. Three pins 68a, 68b, 68c protrude from the bottom of the metal case 65.

The stem 61 is made of brass and is a circular plate 5.6 mm in diameter. A notch 61a is provided in the periphery of the stem 61 to regulate an installation angle of the semiconductor laser device 6. A box shaped brass sub-mount 62 integrally formed with the circular plate portion of the stem 61 is formed on the upper surface of the stem 61. The sub-mount 62 is disposed so that one surface of the sub-mount 62 is disposed along a central axis of the stem 61. A laser diode 63 is provided to the sub-mount 62 at an upper portion of the surface along the center axis of the stem 61. The laser diode 63 includes two laser emitting portions 63a, 63b. The laser emitting portions 63a, 63b are disposed so that each can emit a laser beam LB in the upward direction (see FIG. 3). A photodiode 64, that is a photoreceptor and is a PIN (positive-intrinsic-negative) photodiode, is disposed below the laser diode 63 on the stem 61. As laser beams are emitted from the laser emitting portions 63a, 63b, the photodiode 64 receives the light from the laser emitting portions 63a, 63b and detects the light amount. Each cathode of the laser emitting portions 63a, 63b and the photodiode 64 are grounded to the stem 61 and the sub-mount 62 by leads (not shown). Therefore, the stem 61 and the sub-mount 62 integrally formed of brass have an excellent electrical conductivity function as a common lead between the laser diode 63 and the photodiode 64.

The pin 68b is provided to the stem 61 at a position opposed to the sub-mount 62 sandwiching the central axis of the stem 61 therebetween. The pins 68a, 68c are provided on both sides of the pin 68b. The pins 68a, 68b, 68c are arranged on a circumference around the central axis so that each center angle formed between two pins that are next to each other is 90 degrees. The pins 68a, 68b, 68c are copper rodlike members and penetrate the stem 61 in a vertical direction perpendicular to the stem 61. About a quarter of each pin 68a, 68b, 68c protrudes from the top of the stem 61 and the rest of each pin 68a, 68b, 68c protrudes from the bottom of the stem 61. Electrical insulation 69a, 69b, 69c is provided between each pin 68a, 68b, 68c and the stem 61, respectively. The electrical insulation 69a, 69b, 69c insulates the pins 68a, 68b, 68c from the stem 61, seals each joint portion between the pins 68a, 68b, 68c and the stem 61, and fixes the pins 68a, 68b, 68c to the stem 61. The top of each pin 68a, 68b, 68c is cut away so that the top of each pin 68a, 68b, 68c becomes flat and thin, and is formed with a connection hole. The pin 68a is electrically connected to an anode of the laser emitting portion 63a by a lead 72a. The pin 68c is electrically connected to an anode of the laser emitting portion 63b by a lead 72c. The pin 68b is electrically connected to an anode of the photodiode 64 by a lead 72b.

The cylindrical-shaped brass cap 67 having a bottom open structure is smaller in diameter than the stem 61. The cap 67 is disposed to cover the sub-mount 62, the pins 68a, 68b, 68c, the laser diode 63 and the photodiode 64 provided on the upper surface of the stem 61. The lower edge of the cap 67 is sealed by a seal 71. A circular light emitting hole 66 is provided at the upper end of the cap 67. A glass plate 70 is inserted into the light emitting hole 66 to provide a hermetic seal. Accordingly, the sub-mount 62, the pins 68, the laser diode 63, and the photodiode 64 are hermetically maintained in the metal case 65 comprising the stem 61 and the cap 67.

Figure 4:
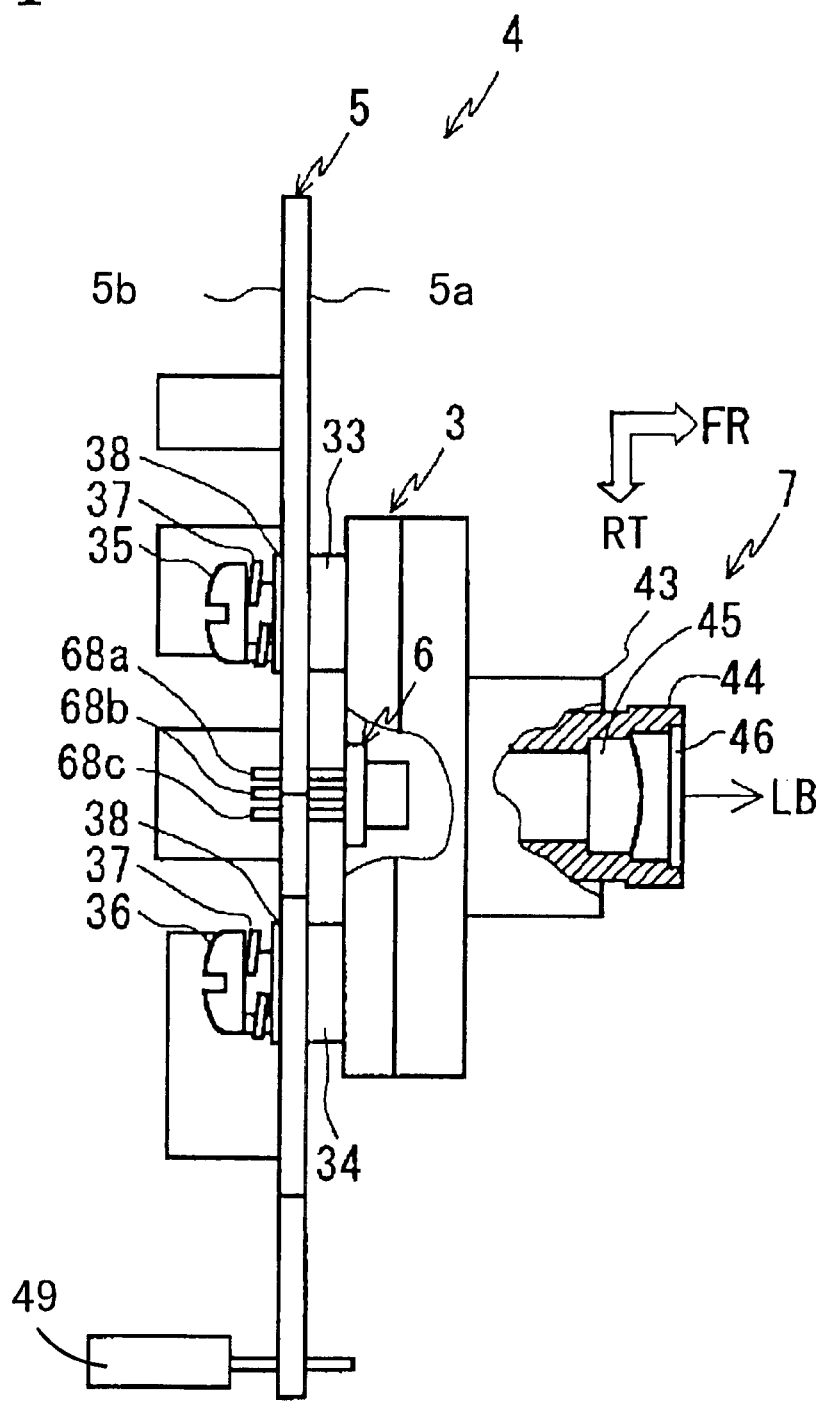
FIG. 4 is a partially cutaway plan view of a laser emitting unit when viewed from a direction perpendicular to a laser emitting direction.

FIG. 4 is a partially cutaway plan view of a laser emitting unit 4 when viewed from a direction perpendicular to the laser emitting direction. Hereinafter, in the drawings, the emitting direction of the laser beam LB is the front FR, the right from the laser emitting direction is RT, the upper direction from the emitting direction is UP. The laser emitting unit 4 includes the semiconductor laser device 6, a support plate 3 into which the semiconductor laser device 6 is press-fit and by which the semiconductor laser device 6 is supported, a drive circuit 5 that drives the semiconductor laser device 6, and a laser collimating unit 7 that adjusts the laser beam LB.

Figure 7:
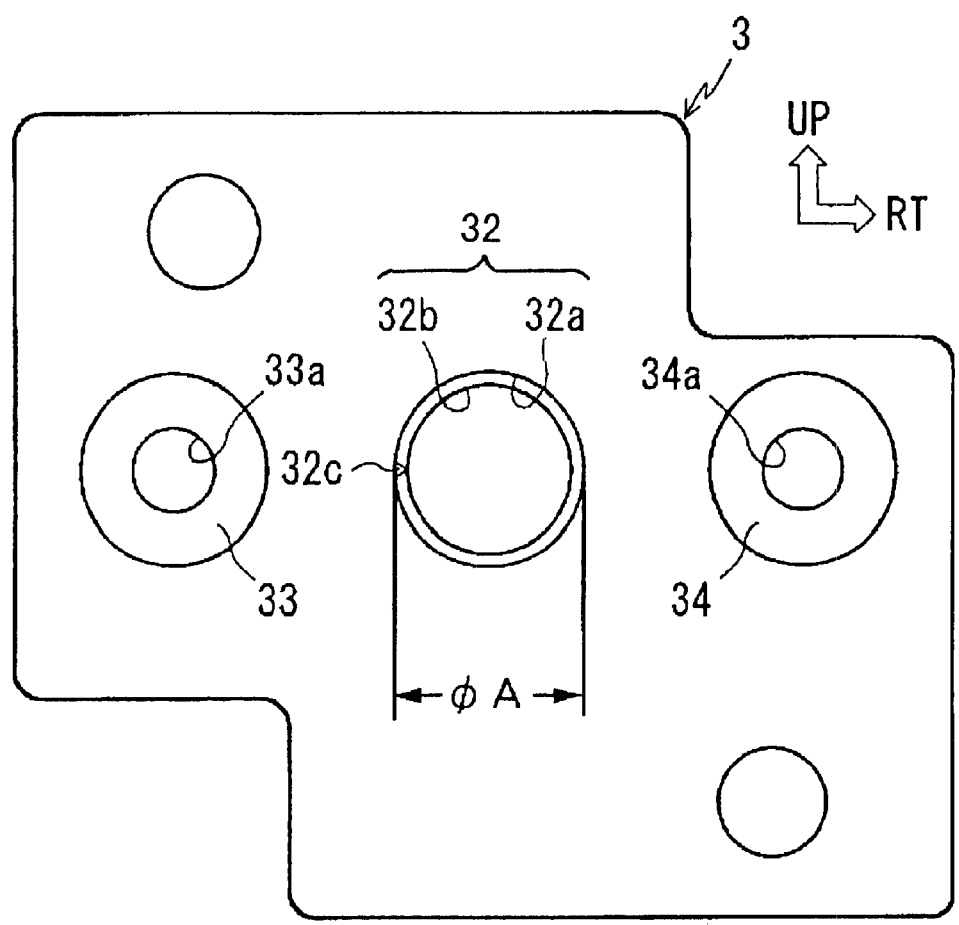
FIG. 7 is a plan view of a support plate when viewed from the back of the laser emitting side.
Figure 8:
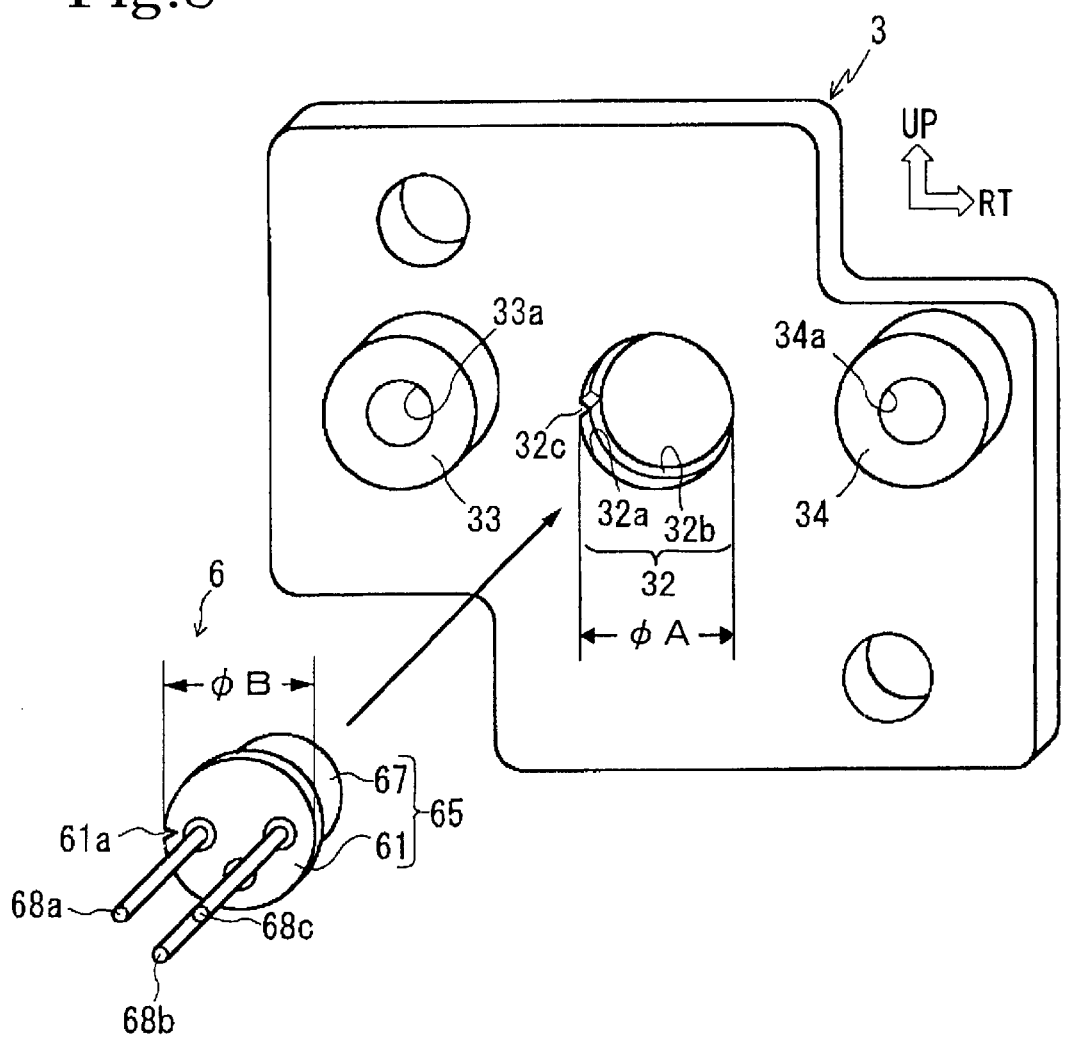
FIG. 8 illustrates a process of press-fitting the semiconductor laser device into the support plate.

FIG. 7 is a plan view of the support plate 3 when viewed from the reverse of the laser emitting side. As shown in FIG. 7, the support plate 3 is made of aluminum and has a penetration hole 32 in its center. The penetration hole 32 includes penetration holes 32a, 32b. The penetration hole 32a, having a large inside diameter, is provided to the back of the support plate 3. The penetration hole 32b, having a smaller inside diameter, is provided to the front of the support plate 3. The stem 61 of the semiconductor laser device 6 is press-fit into the penetration hole 32a. FIG. 8 shows a process of press-fitting the semiconductor laser device 6 into the support plate 3. The semiconductor laser device 6 has the metal case 65 that includes the stem 61 having a diameter of 5.6 mm and the cap 67 whose outside diameter is smaller than the diameter of the stem 61. The circular penetration hole 32a having a diameter φA is provided in the back side of the support plate 3 in the laser emitting direction and the penetration hole 32b having a diameter that is a little larger than that of the cap 67 is provided in the front side of the support plate 3 in the laser emitting direction.

The diameter φB of the stem 61 is approximately 5.6 mm. The diameter φB generally conforms to the JIS Standards or the like. The diameter φA of the penetration hole 32a provided in the support plate 3 is smaller than the diameter φB of the stem 61. The difference between the two diameters is that the stem is allowed to be press-fit into the penetration hole 32a. That is, when the stem 61 is press-fit into the penetration hole 32a, the periphery of the penetration hole 32a of the support plate 3 is deformed so as to intimately contact the stem 61. More specifically, when the support plate 3 is made of aluminum, the difference between the two diameters is set to between 5 μm and 60 μm. For example, when a tolerance of the stem 61, having a diameter of 5.6 mm, is 5.600 mm–35 μm, the diameter of the penetration hole is designed to be 5.560 mm–20 μm. The stem 61 could be suitably press-fit into the penetration hole 32a when the difference of the two diameters was set to between 5 μm and 15 μm for hard aluminum support plate 3 and between 40 μm and 50 μm for soft aluminum support plate 3. Generally, when the difference between the two diameters is set to between 5 μm and 60 μm, the stem 61 can be intimately fixed to the support plate 3.

As shown in FIG. 8, a key 32c is provided to a wall defining the penetration hole 32a. The semiconductor laser device 6 cannot be press-fit into the support plate 3 unless the key 32c coincides with the notch 61a. Consequently, the semiconductor laser device 6 is inserted into the support plate 3 so that the pins 68a, 68b, 68c are surely in the correct posture. The semiconductor laser device 6 is press-fit into the support plate 3 using a device (not shown) that presses the entire stem 61 without applying a force to the pins 68a, 68b, 68c so that the stem 61 is not deformed. When the semiconductor laser device 6 is inserted to a predetermined position, the front edge of the stem 61 makes contact with a stepped portion formed by the penetration holes 32a, 32b. When the semiconductor laser device 6 completely contacts the stepped portion, the semiconductor laser device 6 is fixed to the support plate 3 at the correct position in a correct posture. The stem 61 of the semiconductor laser device 6 press-fit and fixed as described above is made of brass and the support plate 3 is made of aluminum. Therefore, the relatively high hardness brass stem 61 is intimately dug into the relatively low hardness aluminum support plate 3. Accordingly, an electrical resistance of a potion where the stem 61 and the support plate 3 make contact with each other is generally lower than 1 ohm. When the semiconductor laser device 6 and the support plate 3 contact each other in an excellent condition, the resistance can be limited to approximately 0.1 ohm. When a current of 50 mA is passed through the cathode of the semiconductor laser device 6, power consumption is between 0.25 mW and 2.5 mW, so that the resistance is negligible. Therefore, this structure has no disadvantage practically as compared with a case where the stem 61 is soldered to the support plate 3. Further, with this structure, the surface of the metal is resistant to oxidizing and does not change its characteristics with time.

As the laser diode 63 emits laser beams LB, some of energy becomes heat, so that heat is generated within the metal case 65. As the temperature in the metal case 65 increases, the efficiency of the laser diode 63, which is a semiconductor, decreases. As a result, even though the laser diode 63 is driven at a predetermined current, the amount of light emitted changes and, thus, an unevenness of exposure results. More particularly, the semiconductor laser device 6 has the two laser emitting portions 63a, 63b, so that a large amount of heat is generated in the metal case 65. Accordingly, brass having excellent heat conductivity is used for the metal case 65 of the semiconductor laser device 6. Further, for the support plate 3, aluminum having comparatively high heat conductivity is used. As described above, intimate contact is increased by press-fitting the stem 61 into the support plate 3, so that heat is effectively conducted from the stem 61 to the support plate 3 to dissipate the heat. That is, the support plate 3 effectively functions as a radiating plate to prevent the semiconductor laser device 6 from increasing in temperature thereby maintaining a stable amount of light.

As described above, by press-fitting the semiconductor laser device 6 into the support plate 3, the stable electrical conduction and effective heat dissipation can be achieved and secular changes can be minimized as compared with a case where the semiconductor laser device 6 is contacted to the support plate pressing one another with screws or by an urging force from a spring.

Next, a structure for connecting the support plate 3, integrated with the semiconductor laser device 6, to the drive circuit 5 will be described. As shown in FIGS. 7 and 8, cylindrical-shaped bosses 33, 34 are integrally formed with the support plate 3 to protrude from the back of the support plate 3, away from the laser emitting direction, and are disposed on both sides of the penetration hole 32. The bosses 33 and 34 are formed with screw holes 33a and 34a, at each center, respectively. The inner surface of the screw holes 33a, 34a is threaded.

Figure 5:
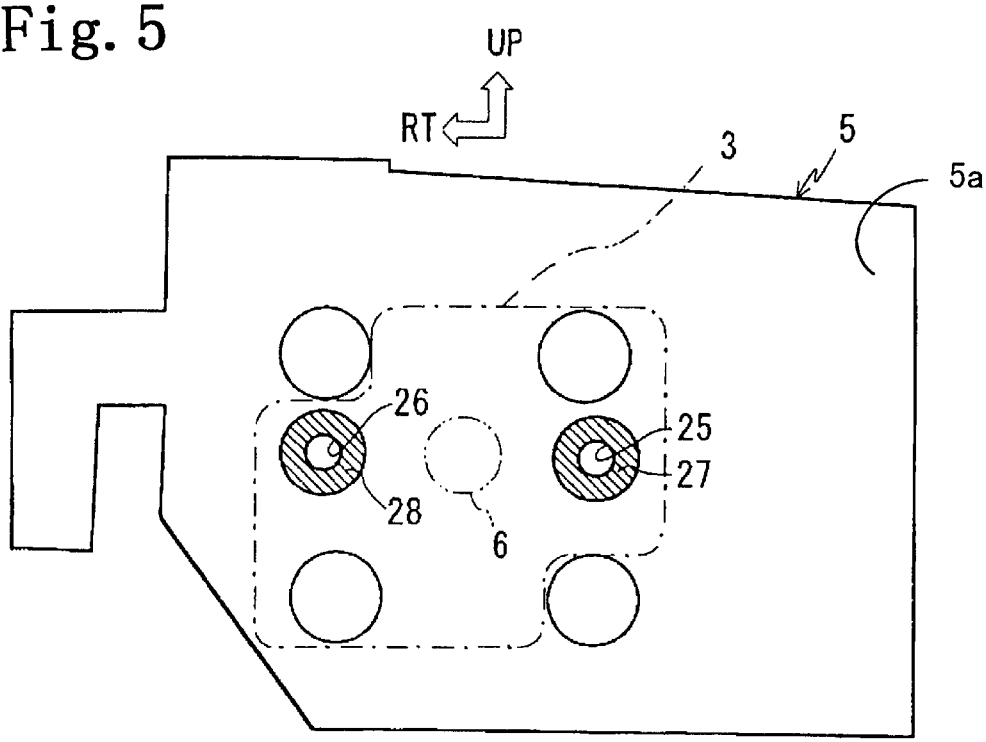
FIG. 5 is a plan view of a solder side of a drive circuit when viewed from the front of a laser emitting side.
Figure 6:
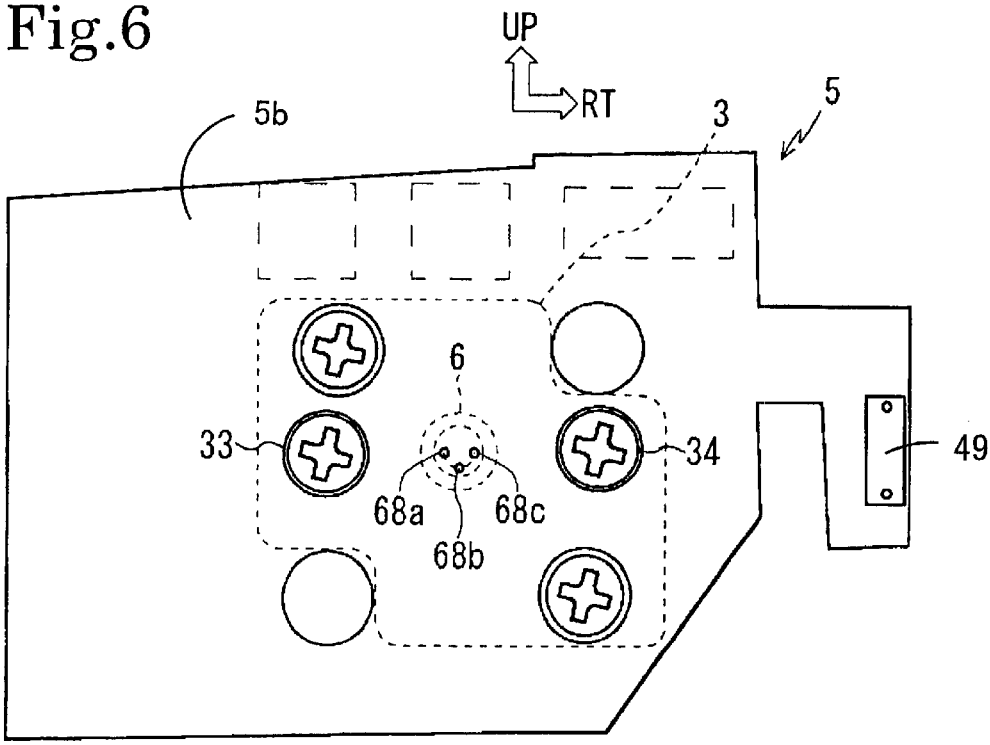
FIG. 6 is a plan view of a component side of the drive circuit when viewed from the back of the laser emitting side.

FIG. 5 is a diagram showing a solder side 5a of the drive circuit 5 when viewed from the front FR, that is, the laser emitting side. FIG. 6 is a diagram showing a component side 5b of the drive circuit 5 when viewed from the back, that is opposite the laser emitting side. The solder side 5a is a side for fixing leads of components mounted on the drive circuit 5 to a printed circuit by soldering. The component side 5b is a side on which components to be mounted on the drive circuit 5 are placed. There are the printed circuit (not shown) and soldered fixed portions (not shown) on the solder side 5a of the drive circuit 5. As shown in FIG. 5, a land engagement hole 25 is formed at a position corresponding to the screw hole 33a of the boss 33. A land engagement hole 26 is also formed at a position corresponding to the screw hole 34a of the boss 34. Lands 27, 28 are provided around the land engagement holes 25, 26, respectively. The lands 27, 28 are conductor portions that are soldered areas for circuit routing on a substrate of the printed circuit. The surfaces of the lands 27, 28 are provided with fine asperities to increase a contact pressure per unit area and to surely electrically conduct when the bosses 33, 34 are contacted to the lands 27, 28, respectively, with pressure. The lands 27, 28 are connected to a ground potential of the drive circuit 5. As shown in FIGS. 4 and 6, the pins 68a, 68b, 68c of the semiconductor laser device 6 pass through from the solder side 5a to the component side 5b and are electrically connected to the drive circuit 5 by soldering.

In the support plate 3, structured as described above, a screw 35 is inserted and tightened in the screw hole 33a by passing through the drive circuit 5 from the component side 5b. A head of the screw 35 presses the drive circuit 5 toward the support plate 3 side via a spring washer 37 and a plain washer 38. Accordingly, the boss 33 contacts the land 27, which is disposed on the solder side 5a of the drive circuit 5, pressing each other. Likewise, a screw 36 is inserted and tightened in the screw hole 34a by passing through the drive circuit 5 from the component side 5b. A head of the screw 36 presses the drive circuit 5 toward the support plate 3 side via the spring washer 37 and the plain washer 38. Accordingly, the boss 34 contacts the land 28, which is disposed on the solder side 5a of the drive circuit 5, pressing each other. Therefore, the continuity between the boss 33 and the land 27 and between the boss 34 and the land 28 is maintained.

The pattern of the lands 27, 28 is preferably changed to increase the ability of contact. For example, wavy or punctate asperities are provided on the surfaces of the lands 27, 28. By doing so, the contact pressure is built up and thus further reliable continuity can be provided. The lands 27, 28 are larger in area than the bosses 33, 34. Therefore, the area where the land contacts the boss is not reduced even when the boss deviates from the land. Further, reliable continuity can be achieved by increasing the continuity of a contact portion between members or applying an antioxidant on the surface of the lands 27, 28.

As shown in FIG. 4, the laser collimating unit 7 regulates laser beams LB emitted from the light emitting hole 66 of the semiconductor laser device 6 to a collimated laser beam and a luminance flux to a predetermined thickness. The laser collimating unit 7 is structured as described below. A lens holder 44, that is adjustable in the back and forth direction, is disposed on a lens-barrel 43 extending in the emitting direction of the laser beam emitted from the laser diode 63. Provided inside the lens holder 44 is a collimator lens 45 that collimates laser beams LB by pulling together the diffused laser beams emitted from the laser diode 63. The laser beams that have passed through the collimator lens 45 are converted into collimated laser beams. However, the luminance flux is thick, so that unnecessary portions of the luminance flux are regulated by a slit 46 to generate a necessary thickness luminance flux.

Figure 2:
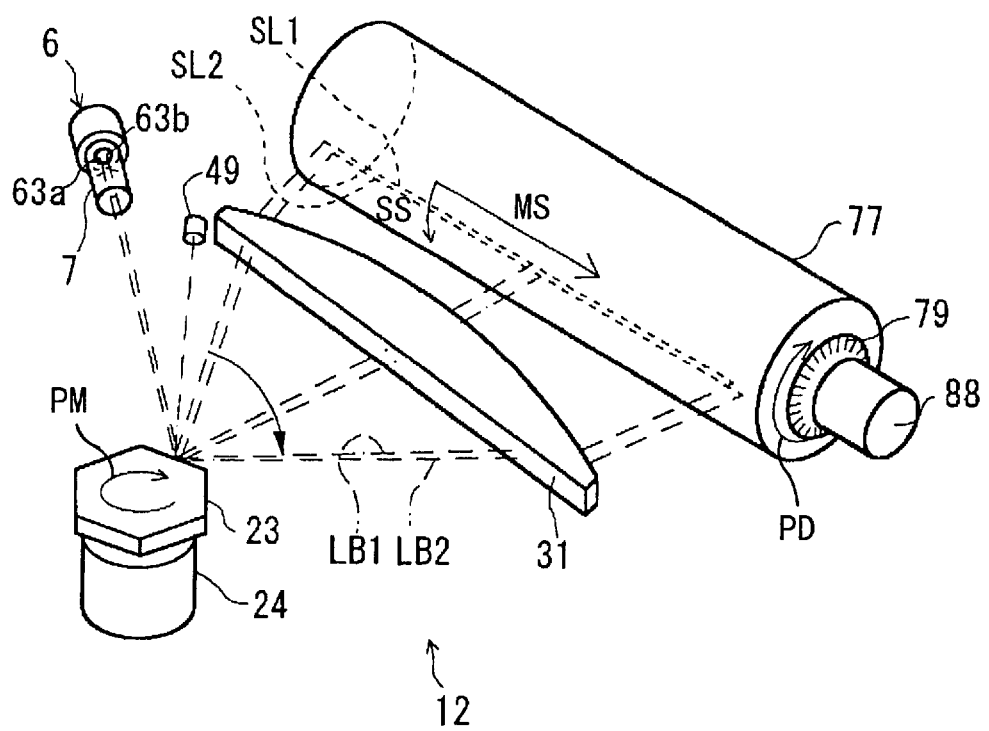
FIG. 2 is a schematic diagram showing functional performance of a laser-beam scanner.

FIG. 2 is a schematic diagram showing operation of the laser-beam scanner 12. As shown in FIG. 2, the laser-beam scanner 12 includes the semiconductor laser diode 6, a polygon mirror 23, and an fθ lens 31. The semiconductor laser device 6 has the laser emitting portions 63a, 63b. Drive signals modulated, based on each image signal, are applied to the laser emitting portions 63a, 63b and, thus, the laser emitting portions 63a, 63b emit laser beams LB1, LB2. Then, the two laser beams LB1, LB2 are collimated by the laser collimating unit 7. The collimated laser beams LB1, LB2 are projected to the polygon mirror 23 via a cylindrical lens (not shown). The polygon mirror 23 is driven by a polygon mirror drive motor 24 to speedily rotate in a direction indicated by an arrow PM to deflect the laser beams LB1, LB2 at a constant angular velocity. The laser beams LB1, LB2 that are deflected at the constant angular velocity are irradiated by the fθ lens 31 so as to substantially simultaneously move in a main scanning direction MS on a surface of a photosensitive drum 77 at a constant linear velocity. As a result, two scan lines SL1, SL2 next to one another on the surface of the photosensitive drum 77 are scanned and exposed.

Figure 1:
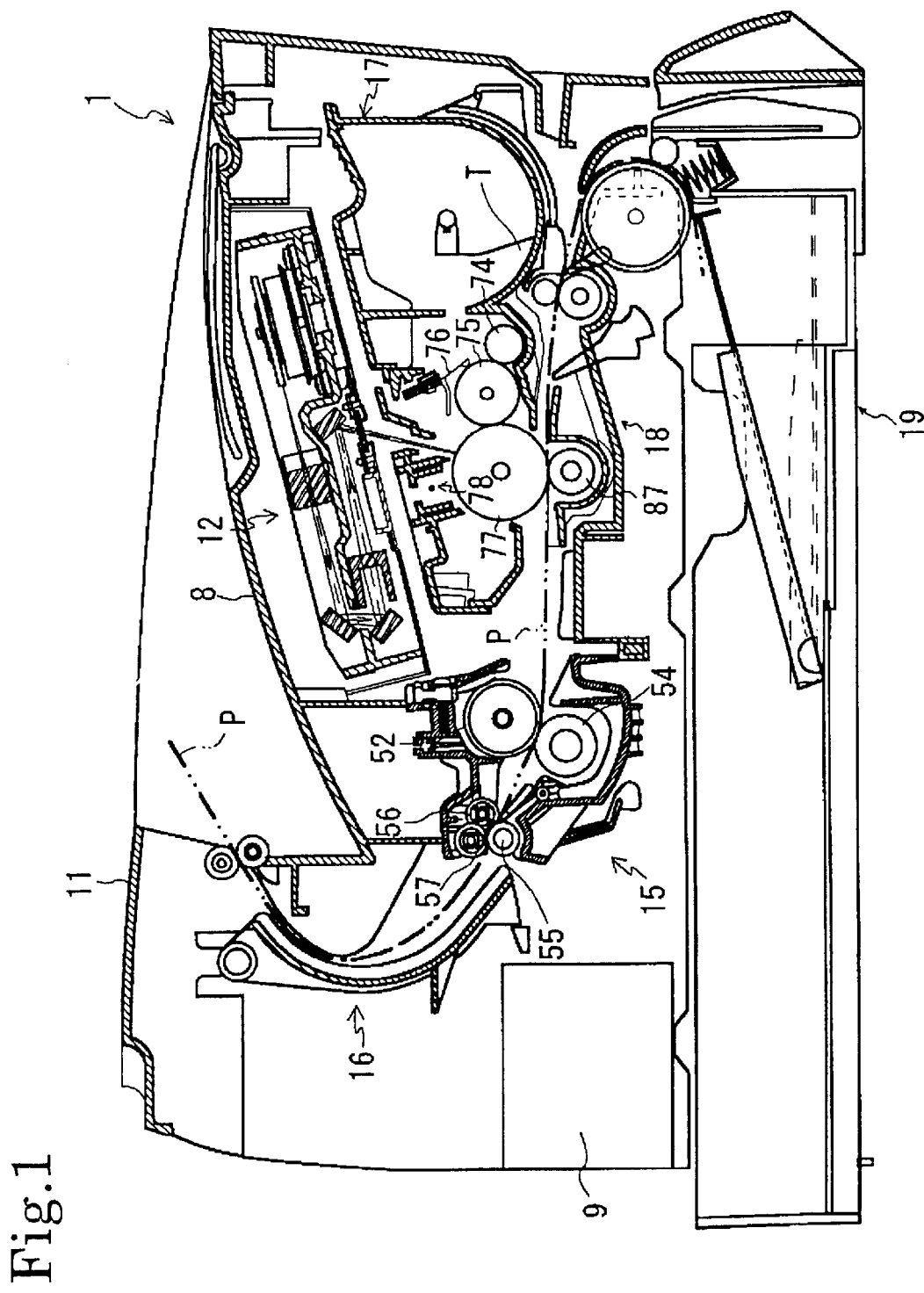
FIG. 1 is a sectional side view of a laser-beam printer when viewed from a direction perpendicular to a sheet transport direction.

The laser beam LB1 is received by a beam detector 49 immediately before starting the scanning of the surface of the photosensitive drum 77 in the main scanning direction MS, and then a start signal for scanning in the main scanning direction MS is sent to a control unit 9 (FIG. 1). The control unit 9 rotates the photosensitive drum 77 by driving a stepping motor 88, as an actuator, so as to synchronize with timing of the scanning in the main scanning direction MS. By rotating the photosensitive drum 77, the photosensitive member to be exposed is moved in a direction indicated by an arrow PD and thus the photosensitive member provided on the surface of the photosensitive drum 77 is scanned with the laser beams LB as the photosensitive member rotates in a direction indicated by an arrow SS, that is, in the sub-scanning direction SS. The entire surface of the photosensitive member is exposed by the laser beams LB and, thus, a latent image is formed on the photosensitive member. Information of the rotation of the photosensitive drum 77 is electrically converted by an optical rotary encoder 79 and fed back to the control unit 9 so as to be regulated. The rotary encoder 79 rotates together with the photosensitive drum 77. The rotary encoder 79 is well-known and structured such that a circular member provided with slits every predetermined angle is sandwiched between a phototransmitter and photoreceptor, that constitutes a light sensor. The rotary encoder 79 detects a laser beam passing through the rotating circular member by the photoreceptor and converts speed information into an electrical signal, such as a pulse.

Next, the structure and function of the laser-beam printer 1 will be described. FIG. 1 is a sectional side view of the laser-beam printer 1 when viewed from a direction perpendicular to a sheet transport direction. The laser-beam printer 1 is formed in a generally box shape by a main frame 11. In FIG. 1, the right is the front of the laser-beam printer 1, and the near side is the left of the laser-beam printer 1. A sheet supply unit 19 is provided at a lower portion of the main frame 11. The sheet supply unit 19 includes a sheet cassette that accommodates a sheet P therein and supplies the sheet P. The sheet P accommodated in the sheet supply unit 19 is transported from the fore part of the laser-beam printer 1 by a transport unit 18. A developing unit 17, that is integrally structured as a processing unit, is provided above the transport unit 18. The laser beam scanner 12, that is a multi-beam emitting apparatus of the invention, is provided above the developing unit 17. In the developing unit 17, the surface of the photosensitive drum 77 is uniformly electrically charged by a scorotron charging device 78 and is then scanned by two laser beams LB1, LB2 that are modulated based on an image signal and are emitted from the laser-beam scanner 12 and, thus, a latent image is formed on the surface of the photosensitive drum 77. Then, the latent image is developed using a developing agent T transported by a transport roller 75, whereby the latent image is manifested and a visible image is formed. Then, the manifested image is transferred onto the sheet P by a transfer roller 87. The sheet P on which the image is transferred is transported to a fixing unit 15 provided on the left side of the developing unit 17 by the transport unit 18. In the integrally structured fixing unit 15, the developing agent T is fixed on the sheet P by applying pressure while the sheet P is being heated. After the developing agent T is fixed on the sheet P, the sheet P is discharged on a printed sheet stacking portion 8 provided at an upper portion of the laser-beam printer 1 by a discharge unit 16 that can change a sheet discharge direction.

Provided in the developing unit 17 are the photosensitive drum 77, the developing roller 75, the supply roller 74, and the charging device 78. The developing roller 75 is disposed in front of the photosensitive drum 77 contacting thereto and rotates in a direction opposite to the rotation of the photosensitive drum 77. The supply roller 74 is disposed in front of the developing roller 75 and rotates in the same direction as the developing roller 75. The charging device 78 is disposed at an upper portion of the photosensitive drum 77.

The supply roller 74 contacts the developing roller 75 so they press against each other to adhere the fine-grained developing agent T to the developing roller 75 by a spongy surface of the supply roller 74 during rotation. A layer thickness regulating blade 76 is pressed by a predetermined force against the developing roller 75 to make the amount of developing agent T adhering the developing roller 75 uniform by removing the excessive developing agent T.

The charging device 78 is a scorotron charging device. The charging device 78 is disposed in parallel with the photosensitive drum 77 while charging wires thereof, comprising a 50 to 100 mm diameter tungsten wire called as a corona wire, are about 10 mm apart from the photosensitive drum 77. The charging device 78 is covered with an aluminum shielded electrode and is provided with a slot along the photosensitive drum 77 at a portion facing to the photosensitive drum 77. In the slot, a grid electrode formed of some wires or meshed wires is provided insulating from the shielded electrode.

The charging wires are connected to a plus terminal of a power supply (not shown) and are applied a high voltage of 5 to 10 kV thereto, whereby a positive ion is generated. The generated positive ion is moved to the surface of the photosensitive drum 77 and thus the surface of the photosensitive drum 77 is charged. Charging potential may be regulated by applying a bias voltage to the grid electrode. Charging also may be regulated by changing the voltage. The surface of the photosensitive drum 77 is positively charged by the charging device 78. The charging device 78 may be a corotron charging device that does not have the grid electrode. Further, the charging device 78 may be other type of charging device if it can cause a corona discharge such as a brush charging.

The positively charged portion of the surface of the photosensitive drum 77 is moved by the rotation of the photosensitive drum 77, irradiated with the laser beams LB1, LB2 from the laser-beam scanner 12 in the main scanning direction MS and in the sub-scanning direction SS, and thus exposed. The photosensitive drum 77 is changed when the developing agent T is replaced, so that its durability is low. However, the photosensitive drum 77 is made up of an OPC (Organic Photoconductor) photosensitive member that is light weight and is low in price. When the laser beams LB1, LB2 are emitted, the conductivity of the surface of the photosensitive drum 77 where the laser beams LB1, LB2 are irradiated increases, so that the charging potential decrease. Thus, a latent image is formed due to potential difference. The photosensitive drum 77 may be made up of such as CdS (cadmium sulfide), a selenic photosensitive member composed of Se (selenium) or Se alloy, or aSi (amorphous silicon) that exposes speedily and has a long-life photoconductivity.

The portion where the latent image is formed by the laser beams LB1, LB2 contacts the developing roller 75 having the developing agent T on its surface by the rotation of the photosensitive drum 77. The developing roller 75 is a rubber roller that is formed by covering a stainless roller shaft with a silicon rubber or an urethane rubber that has dispersed carbon black to provide conductivity. The surface of the developing roller 74 is covered with a fluoroplastic coating. The developing agent T adhering to the developing roller is positively electrically charged by the supply roller 74 and the layer thickness regulating blade 76 due to friction.

When the developing roller 75 contacts the photosensitive drum 77, the developing agent T adheres to the portion where the charging potential is reduced due to exposure to the laser beams LB1, LB2. Thus, the latent image is manifested and visualized and the developing operation is completed. Remaining developing agent T on the photosensitive drum 77 is collected by the developing roller 75. The developed image is transported to a position opposite to the sheet P positioned at a nip portion between the transfer roller 87 and the photosensitive drum 77 by the rotation of the photosensitive drum 77.

The transfer roller 87 is a conductive roller that is formed by covering a roller shaft with a silicon rubber or a urethane rubber that includes dispersed carbon black to provide conductivity. The transfer roller 87 is connected to a minus terminal of the power supply (not shown) and is applied a voltage. Therefore, the sheet P is applied the voltage from the transfer roller 87. The sheet P contacts the photosensitive drum 77 and the transfer roller 87 presses the sheet P toward the photosensitive drum 77. Thus the image formed on the photosensitive drum 77 with the developing agent T is transferred onto the sheet P.

When the sheet P, on which the image is transferred, enters the fixing unit 15, as transported by the transport unit 18, the image formed on the sheet P with the developing agent T is pressed against a surface of a heat roller 52 by a press roller 54. At the time, the surface of the heat roller 52 has a high temperature, so that the developing agent T is melted and penetrates into the fiber of the sheet P.

The discharge unit 16 includes a first discharge roller 55, a first following roller 56 and a second following roller 57. The first discharge roller 55 is disposed downstream of the heat roller 52 in the sheet transport direction and is driven by a driving device (not shown). The first following roller 56 and the second following roller 57 follow the first discharge roller 55. The sheet P is discharged from the fixing unit 15 to the printed sheet stacking portion 8 provided at the upper portion of the laser-beam printer 1 by the discharge unit 16.

With the structures and functions described above, the laser-beam printer 1 having the laser-beam scanner 12 of the embodiment has the advantages described below. The laser beam scanner 12 includes the semiconductor laser device 6 that is provided with the metal case 65 and the connecting pins 68a, 68b, 68c, the support plate 3, the laser emitting unit 4, and the polygon mirror 5. The laser diode having the laser emitting portions 63a, 63b and the photodiode 64 are sealed in the metal case 65. The metal case 65 is commonly electrically connected to the cathode of the laser emitting portions 63a, 63b and the photodiode 64 and has the light emitting hole 66. The connecting pins 68a, 68b, 68c are connected to the laser emitting portions 63a, 63b and the photodiode 64 by the leads 72a, 72b, 72c. The connecting pins 68a, 68b, 68c are insulated from the metal case 65 while conducting between the outside and the inside of the metal case 65. The metal case 65 is press-fit into the support plate 3 electrically connecting them together. The support plate 3 supports the semiconductor laser device 6. The laser emitting unit 4 is provided with the drive circuit 5 that is electrically connected to the support plate 3 and drives the semiconductor laser device 6. The polygon mirror 23 deflects the laser beams LB emitted from the laser emitting unit 4. Accordingly, the number of connecting pins can be reduced as compared with a case where all electrical connection is established using the connecting pins. In particular, the metal case 65 is press-fit into the support plate 3, so that the efficiency of electrical connection and heat conduction is excellent. A reliable electrical connection can be maintained without soldering for a while. Further, heat generated by the laser emitting portions 63a, 63b can be efficiently dissipated.

The semiconductor laser device 6 has the laser diode 63 having the two laser emitting portions 63a, 63b. However, the semiconductor laser device 6 is provided with only the three connecting pins 68a, 68b, 68c, so that the semiconductor laser device 6 can be of the same structure as the conventional semiconductor laser device. Therefore, conventional production equipment, such as a convayance apparatus and a testing apparatus can be used for transporting and testing the semiconductor laser device 6.

Furthermore, the support plate 3 is connected to the ground potential of the drive circuit 5, so that a special connection structure is unnecessary when the metal frame is the ground potential.

Because the support plate 3 is provided with leglike bosses 33, 34 electrically connectable to the drive circuit 5, the occurrence of the surge current due to poor contact can be prevented. Accordingly, malfunction of the drive circuit 5, failure of laser emission, static damage of the laser diode and the like can be prevented and the laser emitting portions 63a, 63b can emit stable laser beams.

The support plate 3 is formed of aluminum that is softer than the brass used to form the metal case 65. The stem 61 of the metal case 65 is press-fit into the penetration hole 32a having an inside diameter φA that is smaller than an outside diameter φB of the stem 61 of the metal case 65. Accordingly, the surface of the inner wall of the penetration hole 32a can intimately contact the surface of the outer wall of the metal case 65. Consequently, stable electrical contact can be maintained between the support plate 3 and the metal case 65, and heat can be radiated with excellent heat conductivity. Further, the semiconductor laser device 6 can avoid an excessive rise in temperature.

The support plate 3 is fixed to the drive circuit 5 using the screws 35, 36. Therefore, the multi-beam emitting apparatus is easy to assemble and a position of the semiconductor laser device 6 supported by the support plate 3 can be adjusted.

The multi-beam emitting apparatus of the invention and the semiconductor laser device capable of being used in the multi-beam emitting apparatus have been described with the semiconductor laser device 6 and the laser-beam scanner 12 of the laser-beam printer 1 of the embodiment as an example. However, the invention can be modified as described below.

A cathode of the semiconductor laser device 6 connected to the metal case 65 is provided to protrude from the metal case 65 as a fourth pin 68*d* (shown by a double dashed chain line in FIG. 3) by brazing. At the time of inspection, the fourth pin 68*d* is connected to the ground potential. Accordingly, the cathode of the semiconductor laser device 6 can be easily maintained at the ground potential. When a current is directly passed through from the metal case 65 to the support plate 3 as in the aforementioned embodiment, the pin 68*d* is unnecessary. Therefore, the pin 68*d* is cut off. When the semiconductor laser device having the pin 68*d* is used in other types of laser scanner, the pin 68*d* can be used for conduction. Therefore, the semiconductor laser device can be easily converted into other devices. The semiconductor laser device 6 can be provided with three or more laser diodes. The support plate 3 is connected to the drive circuit 5 by the two bosses 33, 34 in the aforementioned embodiment. However, three or more bosses can be provided to the support plate 3.

In the forgoing embodiment, the polygon mirror 23 is used for deflecting a light beam. However, a galvanometer or a hologram disk may be used instead. Further, the optical system, including the laser collimating unit 7, is not limited to the structure described above. The photosensitive body is also not limited to the cylindrical drum type. A flat plate type or a belt type photosensitive body may be used. Furthermore, the multi-beam emitting apparatus can be widely applied to other than the laser-beam printer.

The multi-beam emitting apparatus of the invention and the semiconductor laser device capable of being used in the multi-beam emitting apparatus have been described according to the embodiment. However, it is to be understood that the invention is not restricted to the particular forms shown in the foregoing embodiment. Various modifications and alterations can be made thereto without departing from the scope of the invention.

What is claimed is:

1. A multi-beam emitting apparatus, comprising:
  a semiconductor laser device including a plurality of laser emitting portions and a metal case that covers the plurality of laser emitting portions therein and has at least one opening through which the lasers beams emitted from the plurality of laser emitting portions reach outside the metal case;
  a support plate supporting the metal case, the metal case being electrically connected to the support plate by press-fitting into the support plate; and
  a drive circuit being electrically connected to the support plate and driving the semiconductor laser device, wherein one terminal of each laser emitting portion is electrically connected to the metal case inside the metal case, another terminal of each laser emitting portion is insulated from the metal case and is conducted to outside of the metal case by respective laser connecting pins.

2. The multi-beam emitting apparatus according to claim 1, wherein the semiconductor laser device includes a photoreceptor and one terminal of the photoreceptor is electrically connected to the inside of the metal case.

3. The multi-beam emitting apparatus according to claim 2, wherein another terminal of the photoreceptor is insulated from the metal case and is conducted to outside of the metal case by a photoreceptor connecting pin.

4. The multi-beam emitting apparatus according to claim 3, wherein the semiconductor laser device further includes a case connecting pin electrically connected to the metal case, and the case connecting pin is cut off before the semiconductor laser device is press-fit into the support plate or before one of the laser connecting pins and photoreceptor connecting pin is connected to the drive circuit.

5. The multi-beam emitting apparatus according to claim 1, wherein the support plate is electrically connected to a ground potential of the drive circuit.

6. The multi-beam emitting apparatus according to claim 5, wherein the support plate is provided with a electrically conductive contact protrusion and is electrically connected to the drive circuit through the electrically conductive contact protrusion.

7. The multi-beam emitting apparatus according to claim 6, wherein the support plate is provided with at least two electrically conductive contact protrusions and is electrically connected to the drive circuit through the at least two electrically conductive contact protrusions.

8. The multi-beam emitting apparatus according to claim 6, wherein the electrically conductive contact protrusion has an engagement hole passing through the electrically conductive contact protrusion, the drive circuit is provided with a perforation and a land formed by covering a circumferential portion of the perforation for metal, and the electrically conductive contact protrusion and the land are contacted for electrical connection by being pressed and fixed to each other with a screw that penetrates through the engagement hole of the electrically conductive contact protrusion and the perforation of the land.

9. The multi-beam emitting apparatus according to claim 8, wherein the support plate is provided with at least two electrically conductive contact protrusions and is electrically connected to the drive circuit through the at least two electrically conductive contact protrusions.

10. The multi-beam emitting apparatus according to claim 1, wherein the support plate is formed of a metal that is softer than the metal used for the metal case and has a penetration hole, and the metal case intimately contacts an inner wall of the penetration hole of the support plate by press-fitting the metal case into the penetration hole of the support plate so that the semiconductor laser device is electrically connected to the support plate.

11. The multi-beam emitting apparatus according to claim 10, wherein the metal case has a cylindrical portion as an outer shape, the penetrate hole of the support plate has a circular shape with a diameter that is 5 to 60 $\mu$m (micrometers) smaller than a diameter of the cylindrical portion of the metal case, and an outer peripheral wall of the cylindrical portion of the metal case intimately contacts an inner wall of the penetration hole of the support plate by press-fitting the cylindrical portion of the metal case into the penetration hole of the support plate so that the semiconductor laser device are electrically connected to the support plate.

12. A laser emitting unit, comprising:
  a semiconductor laser device, including:
    a metal case having a stem and a cap attached to the stem, the cap having an opening in an end opposite to the attachment end;

a laser diode having at least two laser emitting portions mounted within the cap;

a photodiode mounted within the cap, the laser diode and photodiode on opposite sides of a plane containing an axis of the semiconductor laser device; and a plurality of contact pins passing through the stem but electrically insulated therefrom at the passthroughs;

a support plate having a hole for receiving the semiconductor laser device; and a drive circuit electrically connected to the support plate, wherein a first terminal of each laser emitting portion is electrically connected to the metal case and a second terminal of each laser emitting portion is connected to a contact pin of the plurality of contact pins.

13. The laser emitting unit according to claim 12, wherein a first terminal of the photodiode is connected to the metal case and a second terminal is connected to a contact pin of the plurality of contact pins.

14. The laser emitting unit according to claim 12, wherein the semiconductor laser device is press fittedly received in the hole of the support plate.

15. The laser emitting unit according to claim 14, wherein the stem has one of a concave portion and a convex portion on an outer periphery and the hole has a complementary one of a convex portion and a concave portion on the perimeter of the hole, the stem being press fitted in the hole of the support plate.

16. The laser emitting unit according to claim 15, wherein the plurality of contacting pins include a contacting pin electrically connected to the metal case that is cut off external to the stem.

17. the laser emitting unit according to claim 12, wherein the support plate is electrically connected to the drive circuit at at least two points.

18. The laser emitting unit according to claim 12, wherein the stem is made of a harder metal than the support plate.

19. The laser emitting unit according to claim 18, wherein the stem is brass and the support plate is aluminum.

20. The laser emitting unit according to claim 12, wherein the stem has a diameter 5 to 60 $\mu$m larger than the hole in the support plate.

* * * * *